(12) United States Patent
Kim et al.

(10) Patent No.: US 9,006,717 B2
(45) Date of Patent: Apr. 14, 2015

(54) ORGANIC LIGHT-EMITTING DISPLAY APPARATUS AND METHOD OF MANUFACTURING ORGANIC LIGHT-EMITTING DISPLAY APPARATUS

(71) Applicants: Sung-Ho Kim, Yongin (KR); Jong-Moo Huh, Yongin (KR); Hye-Dong Kim, Yongin (KR)

(72) Inventors: Sung-Ho Kim, Yongin (KR); Jong-Moo Huh, Yongin (KR); Hye-Dong Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 196 days.

(21) Appl. No.: 13/649,724

(22) Filed: Oct. 11, 2012

(65) Prior Publication Data

US 2013/0270526 A1 Oct. 17, 2013

(30) Foreign Application Priority Data

Apr. 17, 2012 (KR) .................. 10-2012-0039967

(51) Int. Cl.
*H01L 35/24* (2006.01)
*H01L 27/12* (2006.01)
*H01L 27/32* (2006.01)
*H01L 51/52* (2006.01)

(52) U.S. Cl.
CPC ........ *H01L 27/1218* (2013.01); *H01L 27/1255* (2013.01); *H01L 27/3265* (2013.01); *H01L 51/5271* (2013.01)

(58) Field of Classification Search
USPC .............................................. 257/40, E51.001
See application file for complete search history.

(56) References Cited

U.S. PATENT DOCUMENTS

2004/0026692 A1 * 2/2004 Ota et al. .................. 257/40
2009/0322657 A1 12/2009 Na et al.

FOREIGN PATENT DOCUMENTS

| JP | 07-004834 | 1/1995 |
| KR | 10-2000-0038698 | 7/2000 |
| KR | 10-2010-0001597 | 1/2010 |

* cited by examiner

*Primary Examiner* — Anthony Ho
(74) *Attorney, Agent, or Firm* — Lee & Morse, P.C.

(57) ABSTRACT

An organic light-emitting display apparatus includes a substrate, a plurality of organic light-emitting diodes on the substrate, and a plurality of capacitors located next to at least one side of one of the organic light-emitting diodes. The capacitors are arranged inside trenches within the substrate.

20 Claims, 9 Drawing Sheets

ORGANIC LIGHT-EMITTING DISPLAY APPARATUS AND METHOD OF MANUFACTURING ORGANIC LIGHT-EMITTING DISPLAY APPARATUS

CROSS-REFERENCE TO RELATED PATENT APPLICATION

This application claims priority under 35 U.S.C. §119 to Korean Patent Application No. 10-2012-0039967, filed on Apr. 17, 2012, in the Korean Intellectual Property Office, and entitled: "Organic Light-Emitting Display Apparatus and Method of Manufacturing Organic Light-Emitting Display Apparatus," which is incorporated by reference herein in its entirety.

BACKGROUND

Display apparatuses are recently replaced by thin flat panel display apparatuses that are portable. Among flat panel display apparatuses, organic light-emitting display apparatuses are self-emission display apparatuses that have a wider viewing angle, better contrast characteristics, and faster response rates than other display apparatuses and thus have drawn attention as next-generation display apparatuses.

SUMMARY

Embodiments may be realized by providing an organic light-emitting display that includes a substrate, a plurality of organic light-emitting diodes (OLEDs) formed on the substrate, a plurality of capacitors located next to at least one side of an OLED, and the capacitors are formed inside trenches formed in the substrate.

The capacitors may be disposed separate from the OLED. The capacitors may be disposed next to two sides of the OLED to have the OLED therebetween. The capacitors may include a first capacitor disposed in a first trench formed in the substrate separate from a first side of the OLED, and a second capacitor disposed in a second trench formed in the substrate separate from a second side of the OLED. The second side of the OLED may be opposite to the first side of the OLED.

A length of the first capacitor may be longer than a length of the first side of the OLED. A length of the second capacitor may be longer than a length of the second side of the OLED.

The organic light-emitting display apparatus may further include at least one transistor including a semiconductor layer, a gate electrode, and source and drain electrodes, and a gate insulating layer disposed between the semiconductor layer and the gate electrode. The OLED may include a pixel electrode that is formed on the gate insulating layer and may be electrically connected to the at least one transistor, an intermediate layer that may be disposed on the pixel electrode and may include a common layer and an emission layer, and an opposite electrode that may be disposed facing the pixel electrode with the intermediate layer disposed therebetween.

The first capacitor may include a first capacitor lower electrode and a first capacitor upper electrode disposed in the first trench. The second capacitor may include a second capacitor lower electrode and a second capacitor upper electrode disposed in the second trench.

The gate insulating layer may be interposed between the first capacitor lower electrode and the first capacitor upper electrode, and between the second capacitor lower electrode and the second capacitor upper electrode. The first capacitor lower electrode and the second capacitor lower electrode may include the same material forming the semiconductor layer.

The first capacitor upper electrode and the second capacitor upper electrode may include the same material forming the pixel electrode. The pixel electrode may include a transparent conductive material.

The common layer may include a hole injection layer, a hole transport layer, an electron transport layer, and an electron injection layer. The hole transport layer, the hole injection layer, the emission layer, the electron transport layer, and the electron injection layer may be sequentially stacked on the pixel electrode.

The opposite electrode may be disposed on the first capacitor upper electrode and the second capacitor upper electrode. The hole injection layer, the hole transport layer, the electron transport layer, and the electron injection layer may be interposed between the opposite electrode and the first capacitor upper electrode or between the opposite electrode and the second capacitor lower electrode.

The semiconductor layer may include amorphous silicon or crystalline silicon. The opposite electrode may be a reflection electrode that reflects light emitted from the emission layer.

Embodiments may also be realized by providing a method of manufacturing an organic light-emitting display apparatus, the method including preparing a substrate to have a plurality of OLED areas, a plurality of capacitor areas, and a plurality of transistor areas, forming trenches in the capacitor areas, processing a first mask forming an active layer in the transistor area and a lower capacitor electrode in the trench area on the substrate, processing a second mask forming each of first electrode units to form a pixel electrode on the OLED area, a gate electrode, and second electrode units to form a capacitor upper electrode that is formed on the capacitor lower electrode in the trench area, processing a third mask forming an interlayer insulating layer including contact holes exposing two edges of the active layer, and openings exposing the first electrode units and the second electrode units, processing a fourth mask forming source and drain electrodes contacting the active layer through the contact holes, the pixel electrode from the first electrode units, and the capacitor upper electrode from the second electrode units, processing a fifth mask forming a pixel-defining layer exposing at least a part of the pixel electrode, forming an intermediate layer including a common layer and an emission layer on the pixel electrode and forming the common layer on an area other than an emission area, and forming an opposite electrode on the intermediate layer and the common layer.

The capacitor area may include a first capacitor area and a second capacitor area disposed next to two sides of the emission area to have the emission area therebetween. The trench area may include a first trench formed in the first capacitor area separate from a first side of the emission area, and a second trench formed in the second capacitor area separate from a second side of the emission area. The second side of the emission area may be opposite from the first side of the emission area.

The organic light-emitting display apparatus may include a first capacitor including a first capacitor lower electrode and a first capacitor upper electrode formed in the first trench, and a second capacitor including a second capacitor lower electrode and a second capacitor upper electrode formed in the second trench.

The processing of the second mask may include forming a gate insulating layer on the resultant of the processing of the first mask, and forming the gate electrode of the transistor the first electrode units to form a pixel electrode on the OLED area, the second electrode units to form the first capacitor upper electrode, and third electrode units to form the second capacitor lower electrode by sequentially stacking and patterning a first conduction layer and a second conduction layer on the gate insulating layer.

The processing of the third mask may include forming a first insulating layer on the resultant of the processing of the second mask, and forming the interlayer insulating layer in the first insulating layer by forming the contact holes exposing source and drain areas of the semiconductor layer and the openings exposing the first, second, and third electrode units.

The processing of the fourth mask may include forming a third conduction layer on the interlayer insulating layer, forming the source and drain electrodes by patterning the third conduction layer, and forming the second capacitor upper electrode formed of the first conduction layer by removing the second conduction layer forming the third electrode units at the same time forming the first capacitor upper electrode formed of the first conduction layer by removing the second conduction layer forming the second electrode units at the same time forming the pixel electrode formed of the first conduction layer by removing the second conduction layer forming the first electrode units.

The processing of the fifth mask may include forming a second insulating layer on the resultant of the processing the fourth mask, and forming the pixel-defining layer by patterning the second insulating layer to expose a transparent conduction material of the pixel electrode. The opposite electrode may be formed on the common layer inside the trench. The common layer may include a hole injection layer, a hole transport layer, an electron transport layer, and an electron injection layer, wherein the hole injection layer, the hole transport layer, the emission layer, the electron transport layer, and the electron injection layer may be sequentially stacked on the pixel electrode.

The common layer may include first common layers and second common layers, wherein the common layer may be formed on the first substrate other than the pixel electrode, wherein the first common layers, the emission layer, the second common layers may be sequentially stacked on the pixel electrode. The opposite electrode may be a reflection electrode reflecting light emitted from the emission layer. A semiconductor layer may include amorphous silicon or crystalline silicon.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items.

Figure 1:
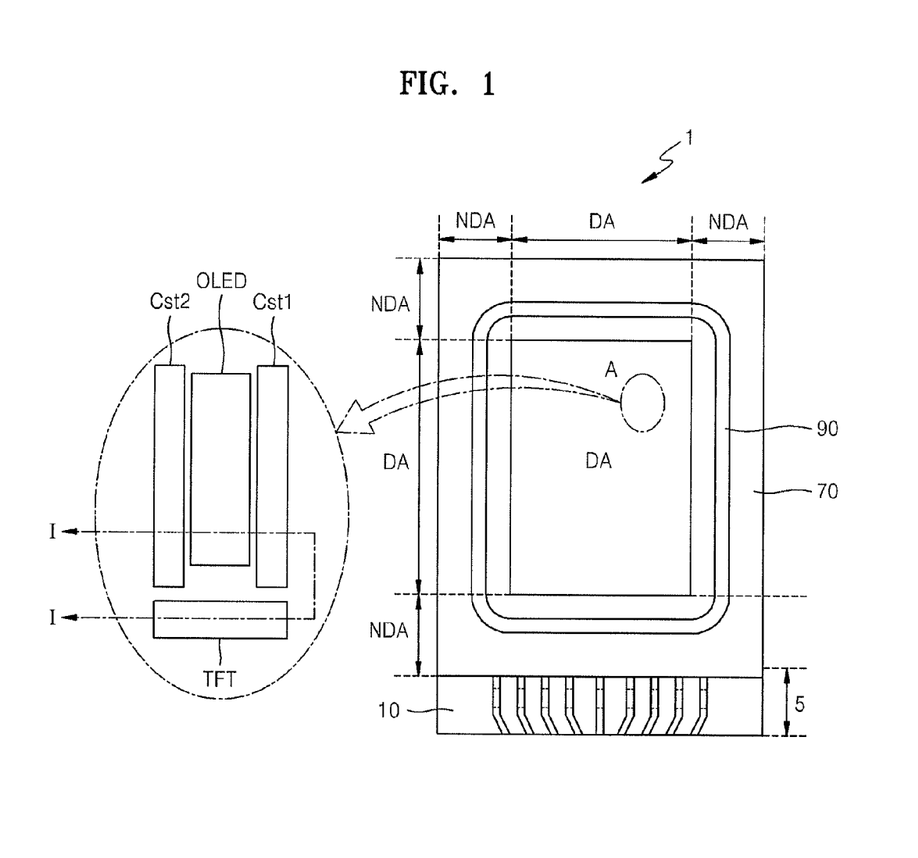
FIG. 1 is a plan view schematically illustrating a structure of an organic light-emitting display apparatus according to an exemplary embodiment.

FIG. 1 is a plane view schematically illustrating a structure of an organic light-emitting display apparatus 1 according to an exemplary embodiment.

Referring to FIG. 1, the organic light-emitting display apparatus 1 includes a first substrate 10 including a plurality of light-emitting diodes, and a second substrate 70 that is adhered to the first substrate 10 by sealing.

A thin film transistor (TFT), an organic light-emitting diode (OLED), first and second capacitors Cst1 and Cst2, and/or the like may be formed on the first substrate 10. The first substrate 10 may be a low-temperature polycrystalline silicon (LTPS) substrate, a glass substrate, or a plastic substrate.

The second substrate 70 may be a sealing substrate that is disposed on, e.g., to cover, the first substrate 10. The second substrate 70 may block external moisture, air, or the like from the TFT, the OLED, and/or the like formed on the first substrate 10. The second substrate 70 is disposed facing the first substrate 10. The first and second substrates 10 and 70 may be attached to each other by a sealing member 90 applied along edges of the first and second substrates 10 and 70. The second substrate 70 may be a glass substrate, a plastic substrate, or a stainless using steel (SUS) substrate.

The first substrate 10 includes a display area DA where light is emitted and a non-display area NDA (an area where light is not emitted) at an outer region of the display area DA, e.g., the non-display area NDA may completely enclose the display area DA. According to an exemplary embodiment, the sealing member 90 may be formed on the non-display area NDA of the outer region of the display area DA. Accordingly, the first and second substrates 10 and 70 may be attached by a sealant in the non-display area NDA.

As described above, the OLED, the TFT driving the OLED, and wirings electrically connecting the OLED and the TFT may be formed on the display area DA of the first substrate 10. Also, a pad area 5 where pad electrodes are formed extensively from the wiring of the display area DA may be formed adjacent to the non-display area NDA, e.g., adjacent to one side of the non-display area NDA. The pad area 5 is also an area where light is not emitted.

Referring to region A showing a magnified part of the display area DA of FIG. 1, the first and second capacitors Cst1 and Cst2 may be disposed with the OLED therebetween. The first and second capacitors Cst1 and Cst2 may be at both sides of the OLED, as described below.

Figure 2:
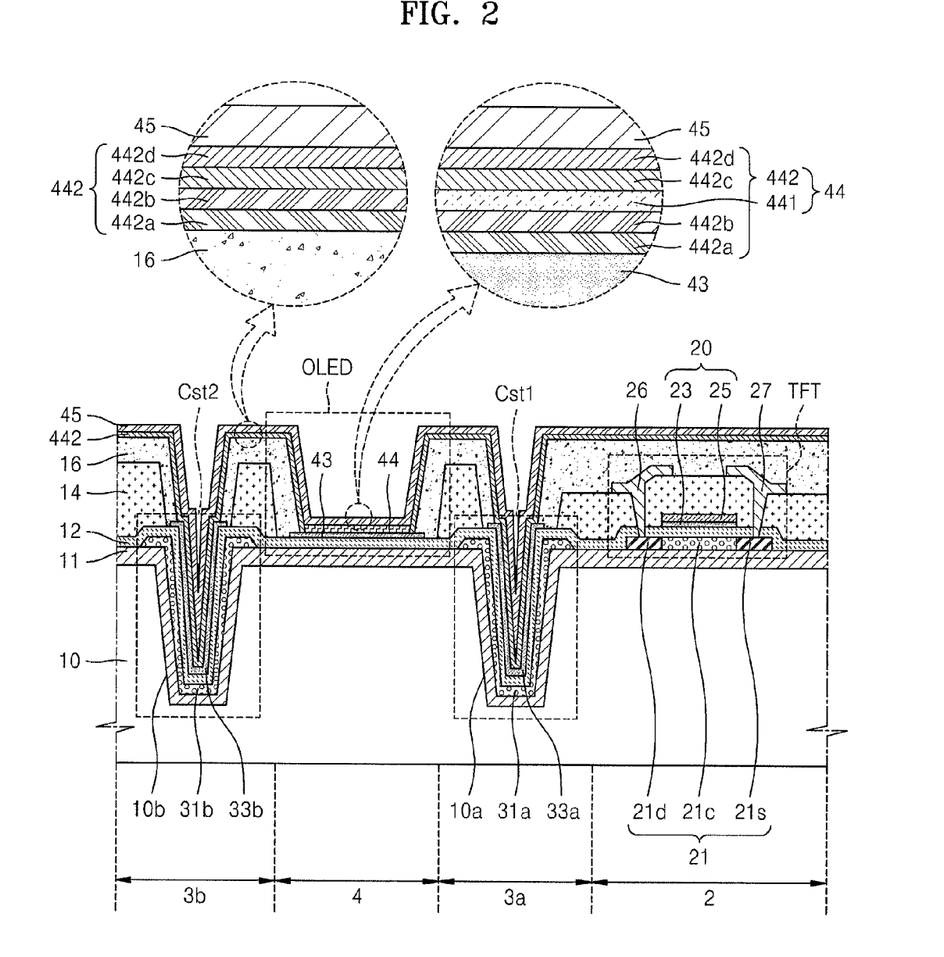
FIG. 2 is a cross-sectional view taken along line I-I of FIG. 1.

FIG. 2 is a cross-sectional view taken along line I-I of FIG. 1.

Referring to FIG. 2, the organic light-emitting display apparatus 1 according to an exemplary embodiment may include a transistor area 2, a first capacitor area 3a, a second capacitor area 3b, and an OLED area 4.

The TFT as a driving element is disposed on the transistor area 2.

The TFT may be constructed with an active layer 21, a gate electrode 20, a source electrode 26, and a drain electrode 27.

The gate electrode 20 may be constructed with a lower gate electrode 23 and an upper gate electrode 25 that is on the lower gate electrode 23. The lower gate electrode 23 may be formed of a transparent conductive material, which may include at least one material selected from indium tin oxide (ITO), indium zinc oxide (IZO), zinc oxide (ZnO), indium oxide ($In_2O_3$), indium gallium oxide (IGO), and aluminum zinc oxide (AZO). The upper gate electrode 25 may be formed of a single layer or a plurality of layers formed of a metal or an alloy of a metal such as Mo, MoW, or an Al-based alloy, but is not limited thereto. A gate insulating layer 12 for insulating the gate electrode 20 from the active layer 21 is interposed therebetween.

The active layer 21 may be formed of a channel area 21c between source and drain areas 21s and 21d. The source and drain areas 21s and 21d are formed at two opposite edges of the channel area 21c. The source and drain areas 21s and 21d are respectively connected to the source and drain electrodes 26 and 27 and are doped with impurities at a high concentration.

A first trench 10a and a second trench 10b are respectively formed in the first capacitor area 3a and the second capacitor area 3b of the first substrate 10. The first capacitor Cst1 may be formed in the first trench 10a, and the second capacitor Cst2 may be formed in the second trench 10b.

The first and second trenches 10a and 10b may be an engraved pattern formed in the first substrate 10. That is, the engraved pattern of the first and second trenches 10a and 10b may be formed toward an opposite surface facing a surface of the first substrate 10 on which a pixel electrode 43 is formed. The first and second trenches 10a and 10b may be formed with the OLED area 4 therebetween. The first trench 10a may be formed separate from one side of the OLED area 4, and the second trench 10b may be formed separate from an opposite side to the side of the OLED area 4. A length of the first and second trenches 10a and 10b may be longer than a length of the pixel electrode 43.

The first capacitor Cst1 may be formed inside the first trench 10a, and the second capacitor Cst2 may be formed inside the second trench 10b. The first capacitor Cst1 consists of a first capacitor lower electrode 31a and a first capacitor upper electrode 33a with the gate insulating layer 12 therebetween. The second capacitor Cst2 consists of a second capacitor lower electrode 31b and a second capacitor upper electrode 33b with the gate insulating layer 12 therebetween.

The first and second capacitor lower electrodes 31a and 31b may be formed of the same material forming the active layer 21 of the TFT. Accordingly, the first and second capacitor lower electrodes 31a and 31b may be formed of a semiconductor material. The first and second capacitor lower electrodes 31a and 31b may be doped with impurities, thus electrical conductivity thereof may be improved. The first and the second capacitor upper electrodes 33a and 33b may be formed respectively inside the first and second trenches 10a and 10b on the gate insulating layer 12.

Since the first and second capacitors Cst1 and Cst2 are respectively formed in the first and second trenches 10a and 10b, a surface area occupied by the first and second capacitors Cst1 and Cst2 is less than when the first and second capacitors Cst1 and Cst2 are formed on a plane surface of the first substrate 10, and thus, the OLED area 4 may be enlarged.

Accordingly, a luminous efficiency of the organic light-emitting display apparatus 1 may be improved.

An OLED is formed on the OLED area 4. The OLED may include the pixel electrode 43 that is connected to one of the source and drain electrodes 26 and 27 of the TFT, an opposite electrode 45 facing the pixel electrode 43, and an intermediate layer 44 interposed between the pixel and opposite electrodes 43 and 45. The pixel electrode 43 may be formed of a transparent conductive material. The pixel electrode 43 may be formed on the same layer and formed of the same material with the lower gate electrode 23 of the TFT. The OLED is described below.

FIGS. 3 to 10 are cross-sectional views schematically illustrating a method of manufacturing the organic light-emitting display apparatus 1 of FIG. 2, according to an exemplary embodiment. Hereinafter, the method of manufacturing the organic light-emitting display apparatus 1 of FIG. 2 will be schematically described.

Figure 3:
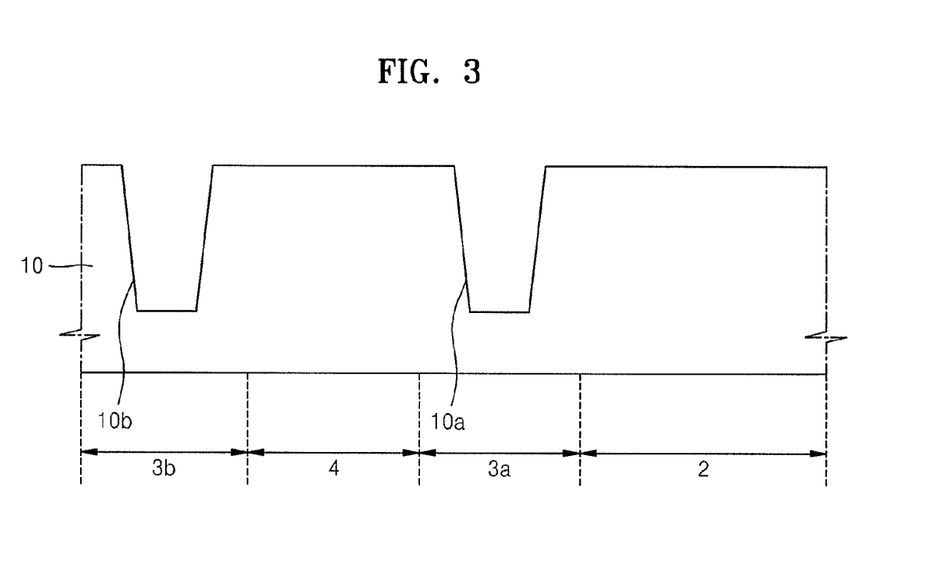
FIGS. 3 through 10 are cross-sectional views schematically depicting stages in a method of manufacturing the organic light-emitting display apparatus of FIG. 10, according to an exemplary embodiment.

First, as shown in FIG. 3, the first and second trenches 10a and 10b are formed in the first substrate 10. For example, the first substrate 10 may be formed of a transparent glass material including silicon dioxide $SiO_2$ as a main component. However, the first substrate 10 is not limited thereto, and a substrate of various materials such as a transparent plastic material or a metal material may be used. The first and second trenches 10a and 10b may be an engraved pattern that is formed from an upper surface of the first substrate 10 toward a lower surface thereof. The first and second trenches 10a and 10b may be respectively formed separate from two opposite sides of the OLED area 4 with the OLED area 4 therebetween.

Figure 4:
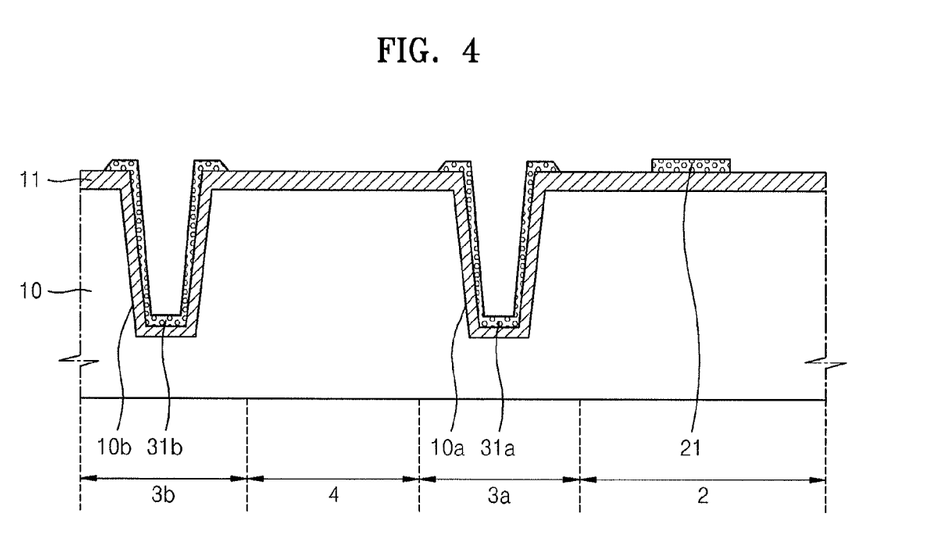

Next, as shown in FIG. 4, an auxiliary layer 11 may be formed on the upper surface of the first substrate 10. The auxiliary layer 11, such as, for example, a barrier layer, a blocking layer, and/or a buffer layer, may be disposed on the upper surface of the first substrate 10 to reduce the possibility of and/or prevent diffusion of impurity ions and infiltration of moisture or external air, and to flatten a surface. The auxiliary layer 11 may be formed by using $SiO_2$ and/or $SiN_x$ through various vapor deposition methods such as a plasma-enhanced chemical vapor deposition (PECVD) method, an atmospheric pressure CVD (APCVD) method, or a low-pressure CVD (LPCVD) method.

Then, the active layer 21 of the TFT, the first capacitor lower electrode 31a, and the second capacitor lower electrode 31b may be formed on the auxiliary layer 11. For example, a poly-crystalline silicon layer (not shown) is formed by vapor depositing and crystallizing an amorphous silicon layer (not shown) on an upper surface of the auxiliary layer 11. The amorphous silicon layer may be crystallized by using various methods such as at least one of a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

The poly-crystalline silicon layer may be patterned into the active layer 21 of the TFT, the first capacitor lower electrode 31a, and the second capacitor lower electrode 31b by performing a mask process using a first mask (not shown). The first capacitor lower electrode 31a may be formed on the auxiliary layer 11 inside the first trench 10a, and the second capacitor lower electrode 31b may be formed on the auxiliary layer 11 inside the second trench 10b.

According to another embodiment, the first and second trenches 10a and 10b in the first substrate 10 may be formed at the same time when the active layer 21 is formed. For example, the poly-crystalline silicon layer may be formed by vapor depositing and crystallizing the amorphous silicon layer (not shown) on the upper surface of the auxiliary layer 11 after forming the auxiliary layer 11 on the first substrate 10. Later, the first and second trenches 10a and 10b and the active layer 21 may be patterned by using a half-tone mask.

Figure 5:
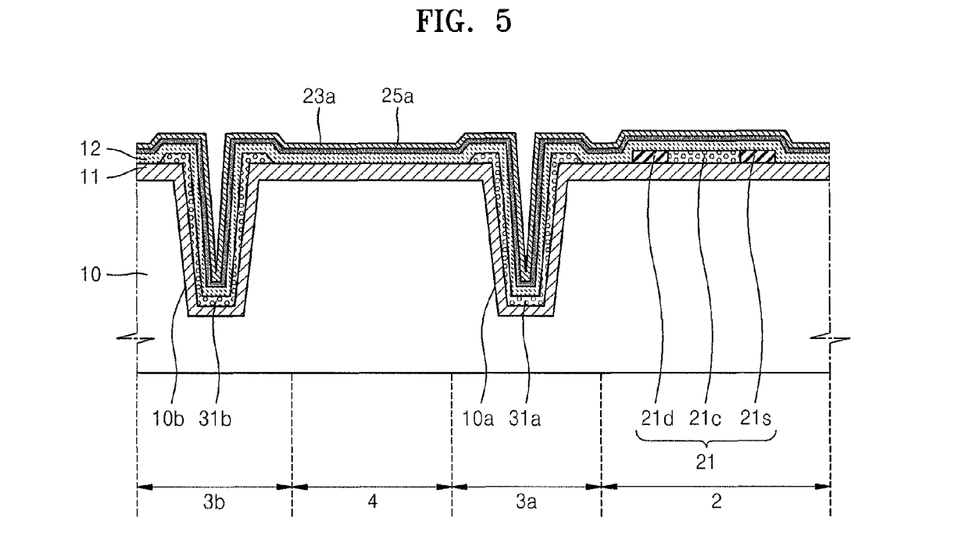

Then, as shown in FIG. 5, the gate insulating layer 12, a first conduction layer 23a, and a second conduction layer 25a are sequentially formed on an entire surface of the first substrate 10 on which the active layer 21 and the first and second capacitor lower electrodes 31a and 31b are formed.

The gate insulating layer 12 may be formed by vapor depositing an inorganic insulating layer such as $SiN_x$ or $SiO_x$ by using a PECVD method, an APCVD method, or an LPCVD method. The gate insulating layer 12 serves as an insulating layer of the TFT by being interposed between the active layer 21 of the TFT and the gate electrode 20, as a dielectric layer of the first capacitor Cst1 by being interposed between the first capacitor upper electrode 33a and the first capacitor lower electrode 31a, and as a dielectric layer of the second capacitor Cst2 by being interposed between the second capacitor upper electrode 33b and the second capacitor lower electrode 31b.

The first conduction layer 23a may include one or more materials selected from ITO, IZO, ZnO, and a transparent material such as $In_2O_3$. Later, the first conduction layer 23a may be patterned into the pixel electrode 43, the lower gate electrode 23, and the first and second upper electrodes 33a and 33b.

The second conduction layer 25a may include one or more materials selected from Ag, Mg, Al, Pt, Pd, Au, Ni, Nd, Ir, Cr, Li, Ca, Mo, Ti, W, MoW, and Cu. For example, the second conduction layer 25a may be formed as a three-layered structure of Mo—Al—Mo. Later, the second conduction layer 25a may be patterned into the upper gate electrode 25.

However, the materials of the first and second conduction layers 23a and 25a are not limited thereto, e.g., as long as embodiments include the first conduction layer 23a having a material that has a better corrosiveness than that of the second conduction layer 25a, and the second conduction layer 25a having a material that has a lower resistance (allowing current to flow better) than that of the first conduction layer 23a.

Figure 6:
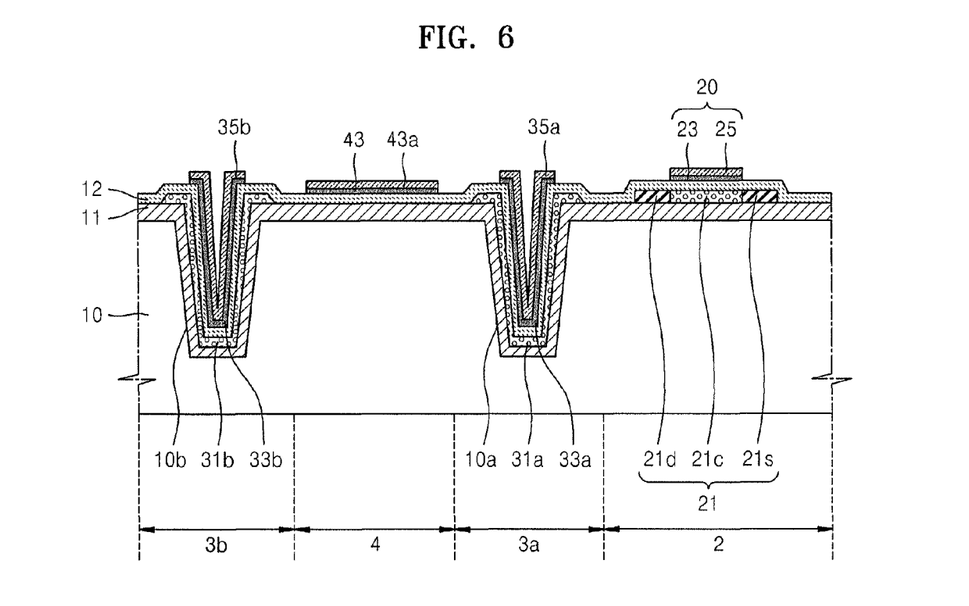

Next, as shown in FIG. 6, the gate electrode 20, first electrode units 43 and 43a, second electrode units 33a and 35a, and third electrode units 33b and 35b are each formed on the first substrate 10, e.g., on the gate insulation layer 12. For example, the first conduction layer 23a and the second conduction layer 25a that are sequentially stacked on the entire surface of the first substrate 10 are patterned by a mask process using a second mask (not shown). As illustrated in FIG. 6, when the first conduction layer 23a and the second conduction layer 25a are selectively removed, the gate insulation layer 12 may not be selectively removed.

In the transistor area 2, the gate electrode 20 is formed to correspond to the active layer 21. The gate electrode 20 includes the lower gate electrode 23 formed from a part of the first conduction layer 23a, and the upper gate electrode 25 formed from a part of the second conduction layer 25a.

The gate electrode 20 is formed to correspond to a center of the active layer 21, and the source and drain areas 21s and 21d are formed at edges of the channel area 21c to correspond to two sides of the gate electrode 20. The source and drain areas 21s and 21d are formed by doping the active layer 21 with n-type or p-type impurities with using the gate electrode 20 as a self-aligned mask. Here, the impurities may be boron ions or phosphor ions.

In the first capacitor area 3a, the second electrode units 33a and 35a are formed on the first capacitor lower electrode 31a to form the first capacitor upper electrode 33a later. In the second capacitor area 3b, the third electrode units 33b and 35b are formed on the second capacitor lower electrode 31b to form the second capacitor upper electrode 33b later. The first electrode units 43 and 43a are formed on the OLED area 4 to form the pixel electrode 43 later.

Figure 7:
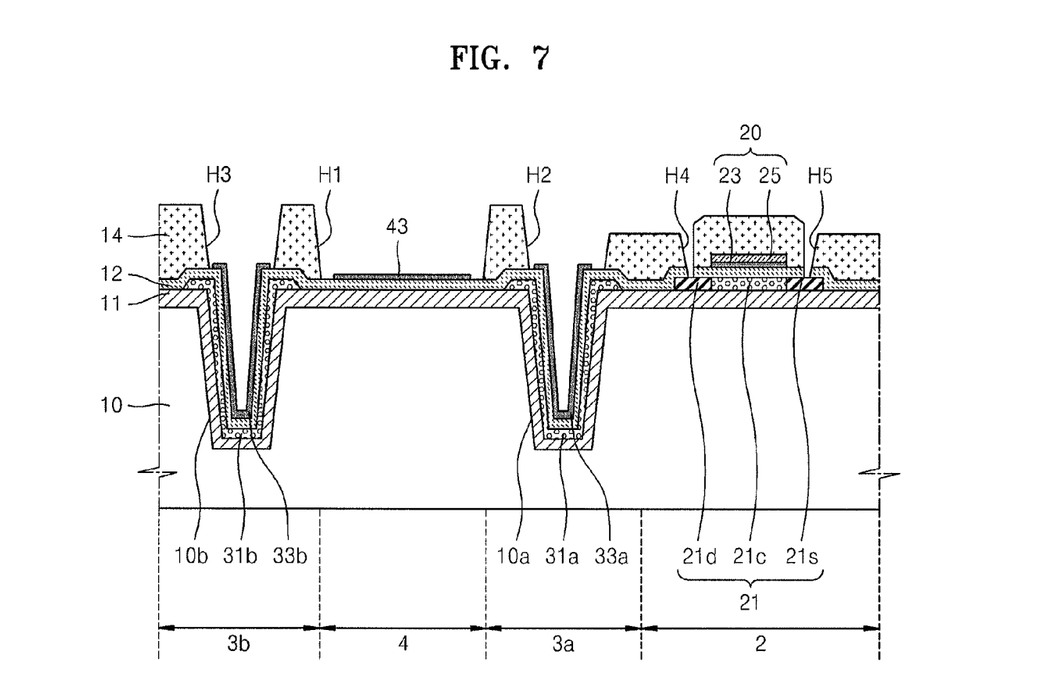

Next, as shown in FIG. 7, an interlayer insulating layer 14 is formed. The interlayer insulating layer 14 includes first, second, and third openings H1, H2, and H3 respectively exposing the pixel electrode 43, the first capacitor upper electrode 33a, and the second capacitor upper electrode 33b. The interlayer insulating layer 14 also includes contact holes H4 and H5 partially exposing the source and drain areas 21s and 21d of the active layer 21, respectively. The interlayer insulating layer 14 is formed by patterning a first insulating layer (not shown) after forming the first insulating layer on the entire surface of the first substrate 10 on which the gate electrode 20 is formed.

The interlayer insulating layer 14 is formed by using a method such as spin coating with one or more organic insulating materials selected from the group polyimide, polyamide, acryl resin, benzocyclobutene, and phenolic resin. The interlayer insulating layer 14 is formed with a sufficient thickness, e.g., to be thicker than the gate insulating layer 12 described above, and thus, serves as an insulating layer between the gate electrode 20 of the TFT and the source and drain electrodes 26 and 27. The interlayer insulating layer 14 may be formed of the inorganic insulating material forming the gate insulating layer 12 described above, as well as the organic insulating material. Also, the interlayer insulating layer 14 may be formed by alternately forming the organic insulating material and the inorganic insulating material.

For example, the interlayer insulating layer 14, including the first, second, and third openings H1, H2, and H3, and the contact holes H4 and H5, is formed by patterning the first insulating layer by a mask process using a third mask (not shown). Here, the contact holes H4 and H5 partially exposes the source and drain areas 21s and 21d, respectively, and the first opening H1 exposes the first electrode units 43 and 43a. The second opening H2 exposes the second electrode units 33a and 35a, and the third opening H3 exposes the third electrode units 33b and 35b.

Figure 8:
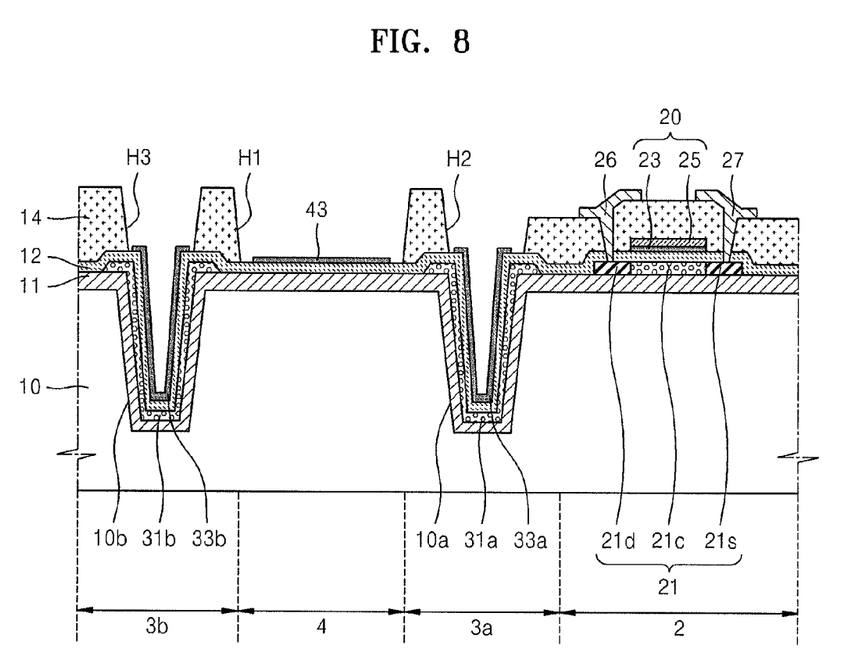

Then, as shown in FIG. 8, the source and drain electrodes 26 and 27, the pixel electrode 43, the first capacitor upper electrode 33a, and the second capacitor upper electrode 33b are each formed by patterning a third conduction layer after forming the third conduction layer (not shown) on the entire surface of the first substrate 10 to cover the interlayer insulating layer 14.

The conduction material of the third conduction layer may be selected from the same conduction materials forming the first or the second conduction layer 23a or 25a described above, but is not limited thereto. Also, the conduction material is vapor deposited to a sufficient thickness to fill space between the contact holes H4 and H5 and the first, second, and third openings H1, H2, and H3.

The source and drain electrodes 26 and 27 are formed by patterning the third conduction layer by a mask process using a fourth mask (not shown).

The pixel electrode 43, the first capacitor upper electrode 33a, and the second capacitor upper electrode 33b are formed at the same time when the source and drain electrodes 26 and 27 are formed. However, embodiments are not limited thereto, e.g., the pixel electrode 43, the first capacitor upper electrode 33a, and the second capacitor upper electrode 33b may be formed by additional etching after forming the source and drain electrodes 26 and 27.

The lower gate electrode 23, the first and second capacitor upper electrodes 33a and 33b, and the pixel electrode 43 are formed from the same material layer.

Here, the first and second capacitor lower electrodes 31a and 31b may be doped by injecting n-type or p-type impurities through the second and third openings H2 and H3. The impurities injected for doping the first and second capacitor lower electrodes 31a and 31b may be identical to or different from the impurities used for doping the active layer 21.

Figure 9:
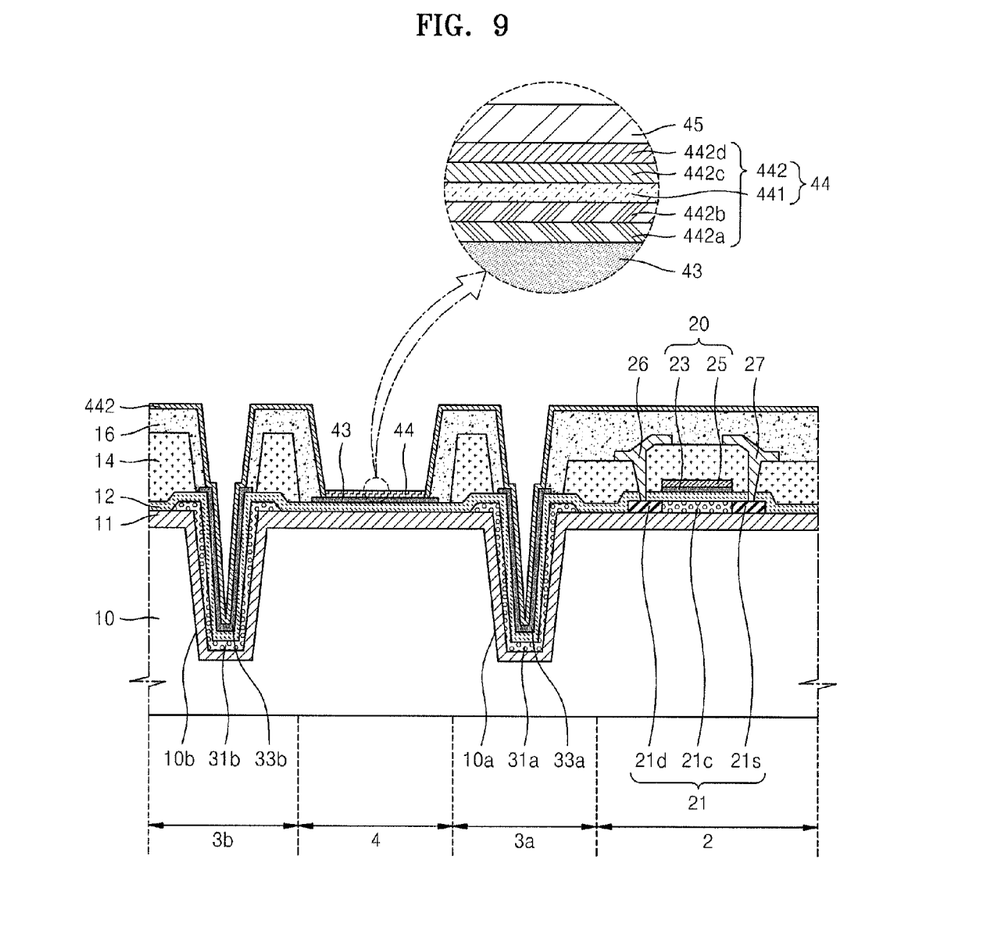

Next, as shown in FIG. 9, a pixel-defining layer (PDL) 16, a common layer 442, and an intermediate layer 44 may be formed on the first substrate 10.

For example, a second insulating layer (not shown) is formed on the entire surface of the first substrate 10 on which the pixel electrode 43, the source and drain electrodes 26 and 27, and the first and second capacitor upper electrodes 33a and 33b are formed. Here, the second insulating layer (not shown) may be formed by using a method such as spin coating with one or more organic insulating materials selected from the group consisting of polyimide, polyamide, acryl resin, benzocyclobutene, and phenolic resin. The second insulating layer may also be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$, as well as the organic insulating material. Also, the second insulating layer may have a multi-layered structure in which the organic insulating material and the inorganic insulating material alternate.

The PDL 16, which defines pixels, may be formed by forming an opening to expose a center of the pixel electrode 43 by patterning the second insulating layer by a mask process using a fifth mask (not shown).

Then, the common layer 442 is formed on the first substrate 10 on which the PDL 16 is formed, and the intermediate layer 44, including an emission layer, is formed in the opening that exposes the center of the pixel electrode 43.

For example, the intermediate layer 44 includes the common layer 442 and an emission layer 441. The common layer includes first common layers 442a and 442b and second common layers 442c and 442d with the intermediate layer 44 that is between the first common layers 442a and 442b and the second common layers 442c and 442d.

The first common layers 442a and 442b may be formed by sequentially stacking a hole transport layer (HTL) and a hole injection layer (HIL), respectively, on the emission layer 441 towards the substrate 10. The second common layers 442c and 442d may be formed by sequentially stacking an electron transport layer (ETL) and an electron injection layer (EIL), respectively, on the emission layer 441 away from the substrate 10.

The common layer 442 may be formed on the substrate 100 except on at least a part of the OLED area 4. That is, the first common layers 442a and 442b and the second common layers 442c and 442d may be sequentially stacked on the PDL 16 and the first and second capacitor upper electrodes 33a and 33b on the first capacitor area 3a, the second capacitor area 3b, and the transistor area 2.

In the OLED area 4, the first common layers 442a and 442b may be formed on the emission layer 441 towards the pixel electrode 43, and the second common layers 442c and 442d may be formed on the emission layer 441 away from the pixel electrode 43.

The emission layer 441 may be an organic emission layer EML. The organic EML may include a low or high molecular weight organic material.

If the organic EML is formed of a low molecular weight organic material, the intermediate layer 44 may include the HTL and HIL of the first common layers 442a and 442b stacked in a direction of the pixel electrode 43 from the organic EML, and the ETL and EIL of the second common layers 442c and 442d stacked in a direction of the opposite electrode 45. The emission layer 441 may include other layers as desired. Here, examples of the low molecular weight organic material include copper phthalocyanine (CuPc), N,N'-Di(naphthalene-1-yl)-N,N'-diphenyl-benzidine (NPB), and tris-8-hydroxyquinoline aluminum (Alq3).

If the organic EML 118 is formed of a high molecular weight organic material, the intermediate layer 44 may only include the HTL of the first common layer 442a in a direction of the pixel electrode 43 from the organic EML. The HTL of the first common layer 442a may be formed on the pixel electrode 43 by a method such as inkjet printing or spin coating using poly-(2,4)-ethylene-dihydroxy thiophene (PEDOT) or polyaniline (PANI). Here, the high molecular weight organic material may be a polyphenylene vinylene (PPV)-based or polyfluorene-based high molecular weight organic material, and a color pattern may be formed by using a common method such as inkjet printing, spin coating, or a thermal transfer method using laser.

Figure 10:
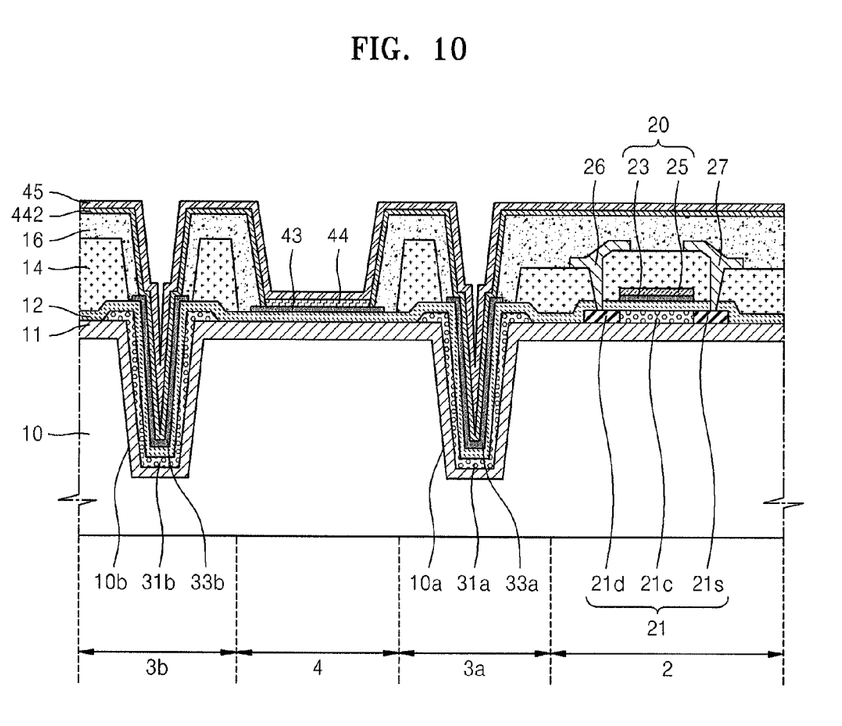

The opposite electrode 45 may be vapor deposited on the entire surface of the first substrate 10 as a common electrode. As shown in FIG. 10, the opposite electrode 45 may be formed inside the first trench 10a of the first capacitor area 3a and the second trench 10b of the second capacitor area 3b.

In a case of the organic light-emitting display apparatus 1 according to an exemplary embodiment, the pixel electrode 43 may be used as an anode, and the opposite electrode 45 may be used as a cathode. However, polarities of the pixel and opposite electrodes 43 and 45 may be the opposite to this.

If the organic light-emitting display apparatus 1 is a bottom emission type display where an image is produced in a direction of the first substrate 10, the pixel electrode 43 is a transparent electrode, and the opposite electrode 45 is a reflection electrode. In this case, the reflection electrode may be formed by thinly vapor depositing a metal having a low work function, e.g., Ag, Mg, Al, Pt, Pd, Au, Ni, Nd, Ir, Cr, Li, Ca, LiF/Ca, LiF/Al, or a compound thereof.

Figure 11:
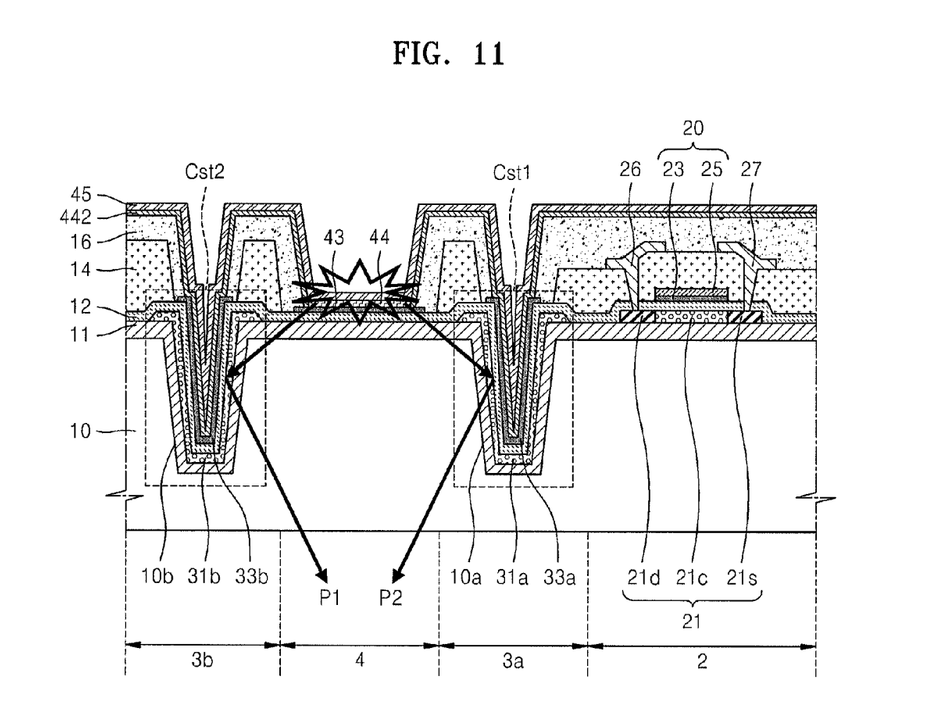
FIG. 11 is a cross-sectional view illustrating paths of light generated by an emission layer of the organic light-emitting display apparatus.

As described above, the opposite electrode 45 may be formed in the first and second trenches 10a and 10b formed at both sides of the OLED. Thus, as shown in FIG. 11, light P1 or P2 generated from the OLED is not totally reflected in the first substrate 10, but rather the light P1 or P2 is reflected by the opposite electrode 45 in the first or the second trench 10a or 10b to exit out, and thus, luminous efficiency of the organic light-emitting display apparatus 1 is improved.

By way of summation and review, organic light-emitting display apparatuses may have an intermediate layer, a first electrode, and a second electrode. The intermediate layer may be arranged between the first electrode and the second electrode. The intermediate layer includes an organic emission layer that generates visible light when a voltage is supplied to the first electrode and the second electrode. Embodiments relate an organic light-emitting display apparatus and a method of manufacturing the organic light-emitting display apparatus with an increased emission area and improved light extraction efficiency (e.g., improved luminous efficiency).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims

What is claimed is:

1. An organic light-emitting display apparatus, comprising:
   a substrate;
   a plurality of organic light-emitting diodes (OLEDs) on the substrate;
   a plurality of capacitors located next to at least one side of one of the OLEDs, the capacitors being arranged inside trenches within the substrate; and
   transistors for each of the plurality of OLEDS, the transistors being on a same surface of the substrate as the OLEDs.

2. The organic light-emitting display apparatus of claim 1, wherein the capacitors are spaced apart from the OLEDs.

3. The organic light-emitting display apparatus of claim 1, wherein the capacitors are arranged next to two sides of the one of the OLEDs such that the one of the OLEDs is between the capacitors.

4. The organic light-emitting display apparatus of claim 1, wherein an active material of the transistors and an electrode of the capacitors is a same material.

5. The organic light-emitting display apparatus of claim 4, wherein the electrode composed of the active material is a lower electrode of the capacitor and an upper electrode of the capacitor is a pixel electrode is a same material as a pixel electrode of the OLED.

6. The organic light-emitting display apparatus of claim 1, wherein an insulating layer of the capacitors is a gate insulating layer of the transistors.

7. The organic light-emitting display apparatus of claim 1, wherein the transistors are adjacent to the OLED and the capacitors on a plane.

8. An organic light-emitting display apparatus, comprising:
   a substrate;
   a plurality of organic light-emitting diodes (OLEDs) on the substrate; and
   a plurality of capacitors located next to at least one side of one of the OLEDs, the capacitors being arranged inside trenches within the substrate, wherein
   the capacitors include:
      a first capacitor arranged in a first trench in the substrate and separate from a first side of the one of the OLEDs, and
      a second capacitor arranged in a second trench in the substrate and separate from a second side of the one of the OLEDs, the second side opposing the first side.

9. The organic light-emitting display apparatus of claim 8, wherein a length of the first capacitor is longer than a length of the first side of the one of the OLEDs.

10. The organic light-emitting display apparatus of claim 8, wherein a length of the second capacitor is longer than a length of the second side of the one of the OLEDs.

11. The organic light-emitting display apparatus of claim 8, further comprising:
   at least one transistor including a semiconductor layer, a gate electrode, source and drain electrodes, and a gate insulating layer arranged between the semiconductor layer and the gate electrode,
   wherein the one of the OLEDs includes:
      a pixel electrode on the gate insulating layer, the pixel electrode being electrically connected to the at least one transistor,
      an intermediate layer on the pixel electrode, the intermediate layer including a common layer and an emission layer, and
      an opposite electrode that faces the pixel electrode with the intermediate layer disposed therebetween.

12. The organic light-emitting display apparatus of claim 11, wherein:
   the first capacitor includes a first capacitor lower electrode and a first capacitor upper electrode arranged within the first trench, and
   the second capacitor includes a second capacitor lower electrode and a second capacitor upper electrode arranged within the second trench.

13. The organic light-emitting display apparatus of claim 12, wherein the gate insulating layer is interposed between the first capacitor lower electrode and the first capacitor upper electrode, the gate insulating layer also being interposed between the second capacitor lower electrode and the second capacitor upper electrode.

14. The organic light-emitting display apparatus of claim 12, wherein the first capacitor lower electrode and the second capacitor lower electrode include a same material as the semiconductor layer.

15. The organic light-emitting display apparatus of claim 12, wherein the first capacitor upper electrode and the second capacitor upper electrode include a same material as the pixel electrode.

16. The organic light-emitting display apparatus of claim 15, wherein the pixel electrode includes a transparent conductive material.

17. The organic light-emitting display apparatus of claim 11, wherein:
   the common layer includes a hole injection layer, a hole transport layer, an electron transport layer, and an electron injection layer, and
   the hole transport layer, the hole injection layer, the emission layer, the electron transport layer, and the electron injection layer are sequentially stacked on the pixel electrode.

18. The organic light-emitting display apparatus of claim 17, wherein:
   the opposite electrode is on a first capacitor upper electrode of the first capacitor and a second capacitor upper electrode of the second capacitor, and
   the hole injection layer, the hole transport layer, the electron transport layer, and the electron injection layer are interposed between the opposite electrode and the first capacitor upper electrode or between the opposite electrode and the second capacitor upper electrode.

19. The organic light-emitting display apparatus of claim 11, wherein the semiconductor layer includes amorphous silicon or crystalline silicon.

20. The organic light-emitting display apparatus of claim 11, wherein the opposite electrode is a reflection electrode that reflects light emitted from the emission layer.

* * * * *